(12) United States Patent
Nie

(10) Patent No.: US 9,791,473 B2
(45) Date of Patent: Oct. 17, 2017

(54) TEST PROBE, TEST PROBE COMPONENT AND TEST PLATFORM

(71) Applicant: SHENZHEN CEWAY TECHNOLOGY CO., LTD., Guangdong (CN)

(72) Inventor: Linhong Nie, Guangdong (CN)

(73) Assignee: Shenzhen Ceway Technology Co., Ltd., Guangdong (CN)

( * ) Notice: Subject to any disclaimer, the term of this patent is extended or adjusted under 35 U.S.C. 154(b) by 0 days.

(21) Appl. No.: 14/894,467

(22) PCT Filed: May 27, 2014

(86) PCT No.: PCT/CN2014/078526
§ 371 (c)(1),
(2) Date: Nov. 27, 2015

(87) PCT Pub. No.: WO2014/190894
PCT Pub. Date: Dec. 4, 2014

(65) Prior Publication Data
US 2016/0116502 A1 Apr. 28, 2016

(30) Foreign Application Priority Data
May 27, 2013 (CN) .................... 2013 2 0291801 U

(51) Int. Cl.
*G01R 31/20* (2006.01)
*G01R 1/067* (2006.01)
(Continued)

(52) U.S. Cl.
CPC ........... *G01R 1/06722* (2013.01); *G01R 1/04* (2013.01); *G01R 31/2808* (2013.01)

(58) Field of Classification Search
CPC .. G01R 3/00; G01R 31/2899; G01R 31/2808; G01R 31/2886; G01R 31/2831;
(Continued)

(56) References Cited

U.S. PATENT DOCUMENTS 4,620,761 A * 11/1986 Smith .................. H05K 7/1069
439/372
6,229,322 B1 * 5/2001 Hembree .......... H01L 21/67253
340/584

(Continued)

FOREIGN PATENT DOCUMENTS

| CN | 201096811 | 8/2008 |
|----|-----------|--------|
| CN | 101728685 | 6/2010 |

(Continued)

OTHER PUBLICATIONS

International Search Report for PCT/CN2014/078526, mailed Sep. 4, 2014, 5 pages.

*Primary Examiner* — Thang Le
(74) *Attorney, Agent, or Firm* — Nixon & Vanderhye, P.C.

(57) ABSTRACT

The present invention discloses a test probe, a test probe component, and a test platform. The test probe comprises a probe body, wherein one end of the probe body is of a hollow design, thereby cooperating with a gold finger through insertion. According to the present invention, one end of the probe body is of a hollow design, thereby cooperating with the gold finger through insertion, thus solving the current technical problems of the assembling of the probe being relatively difficult, the requirements for processing of the through-hole being relative high, and the powering on being unstable.

15 Claims, 11 Drawing Sheets

(51) Int. Cl.
  *G01R 1/04* (2006.01)
  *G01R 31/28* (2006.01)

(58) Field of Classification Search
  CPC ............ G01R 31/2648; G01R 31/2884; G01R 31/2887; G01R 1/06716; G01R 1/06722; G01R 1/06788; G01R 1/0433; G01R 1/0466; G01R 1/0483; G01R 1/07342; G01R 1/07378; G01R 1/07314; G01R 1/07371
  USPC .......... 327/754.01, 754.03, 754.05, 327/754.07–754.11, 756.01–756.07, 724
  See application file for complete search history.

(56) References Cited

U.S. PATENT DOCUMENTS

| | | | | |
|---|---|---|---|---|
| 6,506,082 | B1* | 1/2003 | Meek | H01R 13/2421 439/700 |
| 6,677,772 | B1* | 1/2004 | Faull | G01R 1/06722 324/755.05 |
| 2002/0093355 | A1* | 7/2002 | Parker | G01R 1/06722 324/755.05 |
| 2004/0164754 | A1* | 8/2004 | Holcombe | G01R 1/07314 324/754.14 |
| 2005/0146341 | A1* | 7/2005 | Winter | G01R 1/0441 324/756.02 |
| 2007/0229099 | A1* | 10/2007 | Campbell | G01R 1/06755 324/755.01 |
| 2014/0361801 | A1* | 12/2014 | Pak | H01R 13/2421 324/755.05 |

FOREIGN PATENT DOCUMENTS

| | | |
|---|---|---|
| CN | 102955050 | 3/2013 |
| CN | 102985833 | 3/2013 |
| CN | 203337694 | 12/2013 |
| JP | 5-256875 | 10/1993 |

* cited by examiner

TEST PROBE, TEST PROBE COMPONENT AND TEST PLATFORM

This application is the U.S. national phase of International Application No. PCT/CN2014/078526 filed 27 May 2014, which designated the U.S. and claims priority to CN Patent Application No. 201320291801.9 filed 27 May 2013, the entire contents of each of which are hereby incorporated by reference.

BACKGROUND OF THE INVENTION

Technical Field

The present invention relates to the technical field of electronic testing and control, in particular to a test probe, a test probe component and a test platform.

Description of Related Art

During production of printed circuit boards, the printed circuit boards are required to undergo the electric performance test to judge the electric parameters (for example the resistance value, capacitance value or inductive reactance) of all components of the printed circuit boards conform to the standard.

A common test method for the printed circuit board is as follows: test points are set on a circuit board; the surfaces of the test points are printed with solder paste; a probe directly contacts the test points with solder paste through an automatic test device or an on-line test device so as to obtain the related electric parameters.

For the current on-line test device, the assembling of the probe is relatively difficult; the requirements for throughhole processing is relatively high, and powering on is unstable.

BRIEF SUMMARY OF THE INVENTION

For this purpose, the embodiments of the present invention provide a test probe, a test probe component, and a test platform.

An embodiment here provides a test probe comprising a probe body, and one end of the probe body being of a hollow design, thereby cooperating with a gold finger through insertion.

The above test probe further comprises an elastic member and a probe head; the probe body is axially provided with a through-cavity; the inner wall of the probe body is provided with a first support portion; the first support portion divides the through-cavity into a first accommodating chamber and a second accommodating chamber which are respectively connected with two ends of the probe body; the first accommodating chamber is used for receiving the gold finger; the elastic member is disposed in the second accommodating chamber and one end of the elastic member is supported on the first support portion; and the probe head is partly disposed in the second accommodating chamber and is supported on the other end of the elastic member.

According to the above test probe, wherein the first accommodating chamber is internally provided with at least two projections which are formed by extruding probe body inside, and the at least two projections are used for holding the gold finger.

According to the above test probe, wherein the probe head is capable of driving the elastic member to withdraw by the thrust effect along its axial direction, thus reducing the length of the test probe.

According to the above test probe, wherein the first support portion is a first flange or a step structure; the first flange is formed by extruding the probe body inside, while the step structure is formed on the inner wall of the probe body.

According to the above test probe, wherein the probe head comprises a probe rod and a probe handle disposed at one end of the probe rod; wherein the cross section size of the probe handle is greater than that of the probe rod; the probe handle is disposed in the second accommodating chamber; the inner wall of the probe body is provided with a second support portion; and the probe handle is limited in the second accommodating chamber by the second support portion.

According to the above test probe, wherein the second support portion is a second flange which is formed by extruding the probe body inside.

According to the above test probe, wherein the elastic member is a metal spring.

According to the above test probe, wherein the axial length of the first accommodating chamber is set to be smaller than the insertion length of the gold finger such that one end of the gold finger is inserted into the second accommodating chamber and contacts the metal spring in the second accommodating chamber.

According to the above test probe, wherein the gold finger comprises an insertion portion and a fixing portion which are in butt joint; the cross section size of the fixing portion is greater than that of the insertion portion such that a step face is formed at the joint between the insertion portion and the fixing portion, and one end of the probe body is supported on the step face.

The present invention also provides a test probe component comprising:

a gold finger fixed on the printed circuit board through insertion; and a test probe comprising a probe body, and one end of the probe body being of a hollow design, thereby cooperating with the said gold finger.

The above test probe component further comprises an elastic member and a probe head; the probe body is axially provided with a through-cavity; the inner wall of the probe body is provided with a first support portion; the first support portion divides the through-cavity into a first accommodating chamber and a second accommodating chamber which are respectively connected with two ends of the probe body; the first accommodating chamber is used for receiving the gold finger; the elastic member is disposed in the second accommodating chamber and one end of the elastic member is supported on the first support portion; and the probe head is disposed in the second accommodating chamber and is supported on the other end of the elastic member; and, the probe head is capable of driving the elastic member to withdraw by the thrust effect along its axial direction, thus reducing the length of the test probe.

According to the above test probe component, wherein the first accommodating chamber is internally provided with at least two projections which are formed by extruding probe body inside, and the at least two projections are used for holding the gold finger.

According to the above test probe component, wherein the elastic member is a metal spring; the axial length of the first accommodating chamber is set to be smaller than the insertion length of the gold finger such that one end of the gold finger is inserted into the second accommodating chamber and contacts the metal spring in the second accommodating chamber; the gold finger comprises an insertion portion and a fixing portion which are in butt joint; the cross section size of the fixing portion is greater than that of the insertion portion such that a step face is formed at the joint between the insertion portion and the fixing portion, and one end of the probe body is supported on the step face.

According to the above test probe component, wherein the probe head comprises a probe rod and a probe handle disposed at one end of the probe rod; wherein the cross section size of the probe handle is greater than that of the probe rod; the probe handle is disposed in the second accommodating chamber; the inner wall of the probe body is provided with a second support portion; the probe handle is limited in the second accommodating chamber by the second support portion; the first support portion is a first flange or a step structure; the first flange is formed by extruding the probe body inside, while the step structure is formed on the inner wall of the probe body; and the second support portion is a second flange which is formed by extruding the probe body inside.

The present invention further provides a test platform comprising:

a signal detecting circuit board;

a gold finger fixed on the signal detecting circuit board; and a test probe comprising a probe body and a probe head, and one end of the probe body being of a hollow design, thereby cooperating with the gold finger through insertion.

According to the above test platform, wherein the test platform also comprises a probe plate, a carrier, a circuit board to be tested and an instrument; the signal detecting circuit board is disposed on the probe plate; the probe plate is provided with a through-hole; the test probe penetrates and partly projects out of the through-hole; the circuit board to be tested is disposed on the carrier, on the side relative to the test probe; the probe head is disposed at the other end of the probe body; the probe plate moves relative to the carrier such that the probe head is connected with the test point on the circuit board to be tested, thereby establishing electric connection between the detecting circuit board and the circuit board to be tested; and the instrument is connected with the interface of the signal detecting circuit board through an instrument interface to detect signals from the test point of the signal detecting circuit board.

According to the above test platform, wherein the test probe further comprises an elastic member; the probe body is axially provided with a through-cavity; the inner wall of the probe body is provided with a first support portion; the first support portion divides the through-cavity into a first accommodating chamber and a second accommodating chamber which are respectively connected with two ends of the probe body; the first accommodating chamber is used for receiving the gold finger; the elastic member is disposed in the second accommodating chamber and one end of the elastic member is supported on the first support portion; and the probe head is disposed in the second accommodating chamber and is supported on the other end of the elastic member; in addition, the probe head is capable of driving the elastic member to withdraw by the thrust effect along its axial direction, thus reducing the length of the test probe.

According to the above test platform, wherein the elastic member is a metal spring; the axial length of the first accommodating chamber is set to be smaller than the insertion length of the gold finger such that one end of the gold finger is inserted into the second accommodating chamber and contacts the metal spring in the second accommodating chamber; the gold finger comprises an insertion portion and a fixing portion which are in butt joint; the cross section size of the fixing portion is greater than that of the insertion portion such a step face is formed at the joint between the insertion portion and the fixing portion, and one end of the probe body is supported on the step face; the first accommodating chamber is internally provided with at least two projections which are formed by extruding the probe body inside, and the at least two projections are used for holding the gold finger.

According to the above test platform, wherein the probe head comprises a probe rod and a probe handle disposed at one end of the probe rod; wherein the cross section size of the probe handle is greater than that of the probe rod; the probe handle is disposed in the second accommodating chamber; the inner wall of the probe body is provided with a second support portion; the probe handle is limited in the second accommodating chamber by the second support portion; the first support portion is a first flange or a step structure; the first flange is formed by extruding the probe body inside, while the step structure is formed on the inner wall of the probe body; and the second support portion is a second flange which is formed by extruding the probe body inside.

By the above technical solution, the embodiments of the present invention provide a test probe, a test probe component and a test platform. One of the probe body is of a hollow design to cooperate with the gold finger through insertion, thus solving the current technical problems of the assembling of the probe being relatively difficult, the requirements for processing of the through-hole being relative high, and the powering on being unstable.

BRIEF DESCRIPTION OF THE SEVERAL
VIEWS OF THE DRAWINGS

To more clearly describe the technical solution in the embodiments of the present invention or in the prior art, the following are brief introduction of the attached drawings used to describe the technology in the embodiments or in the prior art. Obviously, the attached drawings described below involve some embodiments of the present invention. For those ordinary skilled in this field, other drawings can be made according to those drawings without creative labor.

DETAILED DESCRIPTION OF THE INVENTION

To make the objectives, technical solutions and advantage of the embodiments of the present invention more clear, the technical solutions in embodiments of the present invention are clearly and completely described below with reference to drawings in the embodiments of the present invention. Obviously, the described embodiments are some embodiments of the present invention, but not all the embodiments of the present invention. Based on the embodiments in the present invention, those ordinary skilled in this field can obtain other embodiments without creative labor, which all shall fall within the protective scope of the present invention.

Figure 1:
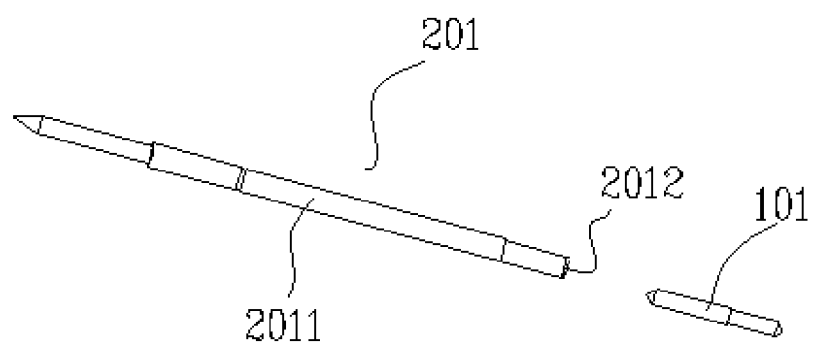
FIG. 1 is a structural view of the probe and gold finger in the first embodiment of a test probe of the present invention.
Figure 2:
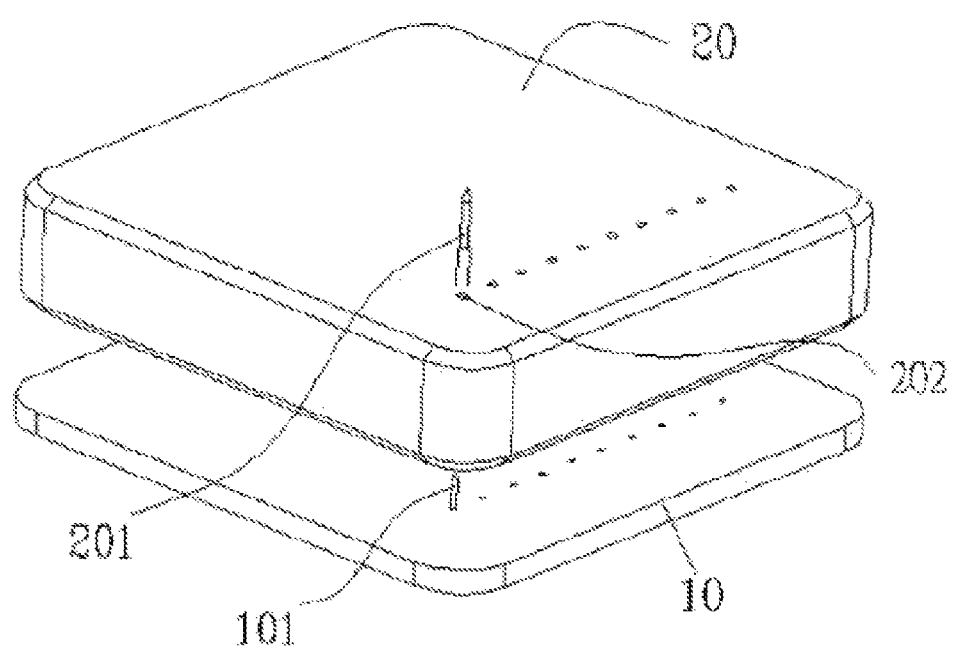
FIG. 2 is a structural view of the first embodiment of a test platform of the present invention.

Refer to FIG. 1 and FIG. 2. The present invention provides a test probe, which is simple and convenient, reduces the processing difficulty and ensures that the powering on is stable during testing.

The above test probe (201) is mainly used in the process that a test device electrically tests a printed circuit board (10); and the printed circuit board (10) is provided with several gold fingers (101). In this embodiment, the test device comprises a probe plate (20); the probe plate (20) is provided with several through-holes (202); the probe plate (20) is disposed opposite to the printed circuit board (10); and the probe plate (20) is disposed directly above the printed circuit board (10).

The test probe (201) mainly comprises a main body (2011) and a probe head (2012) disposed at a tail end of the main body (2011); the main body (2011) is shaped as a long strip; the main body (2011) correspondingly passes through the through-hole (202) formed on the probe plate (20) and is fixed on the probe plate (20), and the probe head (2012) disposed at one tail end of the main body (2011) is exposed out of one side of the probe plate (20). The probe head (2012) is hollow. The test probe (201) is disposed in a way of corresponding to the positions of the gold fingers (101) on the printed circuit board (10), so during the electric testing, the probe plate (20) moves close to the printed circuit board (10), and the hollow probe head (2012) in the test probe (201) is correspondingly inserted into the gold fingers (101) on the printed circuit board (10). Then, the power can be turned on to perform corresponding tests.

The combination of the test probe and the gold fingers is the first realization mode of the test probe component of the present invention. The combination of the test probe (201), the gold fingers (101), the probe plate (20) and the printed circuit board (10) is the first realization mode of the test platform of the present invention. The specific structure of the test probe, the test probe component and other embodiments of the test platform of the present invention are described in detail below.

Figure 3:
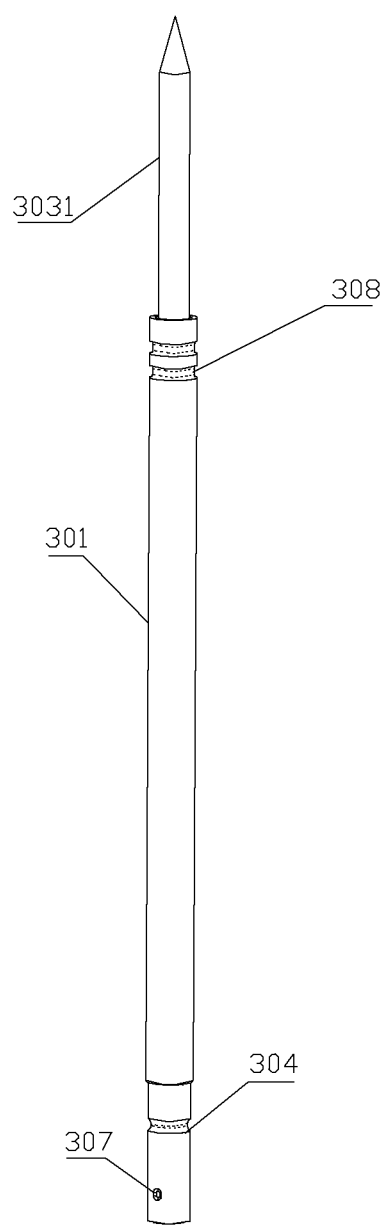
FIG. 3 is a three-dimensional view of the second embodiment of a test probe of the present invention.
Figure 4:
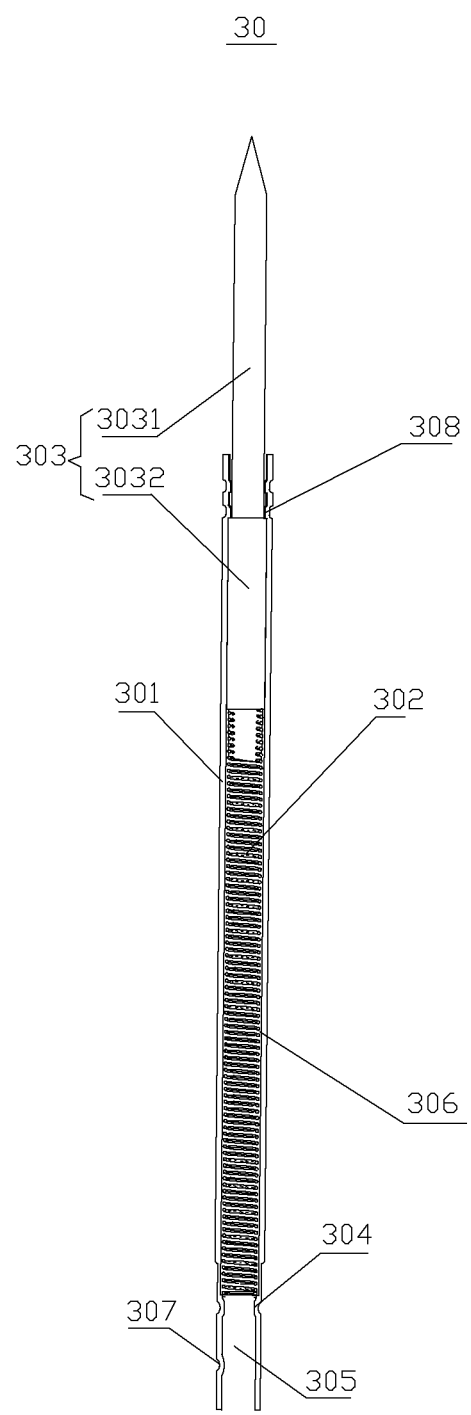
FIG. 4 is a sectional view of the second embodiment of a test probe of the present invention.

The embodiment of the present invention further provides a second realization mode of the test probe. Refer to FIG. 3 and FIG. 4 together, wherein FIG. 3 is a three-dimensional view of the second embodiment of a test probe of the present invention, and FIG. 4 is a sectional view of the second embodiment of a test probe of the present invention.

As shown in FIG. 3 and FIG. 4, in the second embodiment of the test probe of the present invention, the test probe (30) comprises a probe body (301), an elastic member (302) and a probe head (303), wherein one end of the probe body (301) is of a hollow design, thereby cooperating with a gold finger (40) (described in details below) through insertion.

Refer to FIG. 4 for details. The probe body (301) is axially provided with a through-cavity. The inner wall of the probe body (301) is provided with a first support portion (304). The first support portion (304) divides the through-cavity into a first accommodating chamber (305) and a second accommodating chamber (306) which are respectively connected with two ends of the probe body (301). The first accommodating chamber (305) is used for receiving the gold finger (40); the elastic member (302) is disposed in the second accommodating chamber (306) and one end of the elastic member (302) is supported on the first support portion (304). The probe head (303) is partly disposed in the second accommodating chamber (306) and is supported on the other end of the elastic member (302).

The probe head (303) comprises a probe rod (3031) and a probe handle (3032) disposed at one end of the probe rod (3031) wherein the cross section size of the probe handle (3032) is greater than that of the probe rod (3031). The probe handle (3032) is disposed in the second accommodating chamber (306); the inner wall of the probe body (301) is provided with a second support portion (308); and the second support portion (308) limits the probe handle (3032) in the second accommodating chamber (306).

Thus, the probe handle (3032) of the probe head (303) and the elastic member (302) are limited in the second accommodating chamber (306). When the other end of the probe rod (3031) is received a pressure along the axial direction of the probe body (301) and towards the direction of the probe handle (3032) of the probe head (303), the elastic member (302) shrinks such that the probe head (303) moves towards the first support portion (304). Thus, reducing the length of the test probe (30). At the same time, the elastic member (302) is elastic, so the other end of the probe rod (3031) is tightly abutted on the article applying the pressure.

Figure 5:
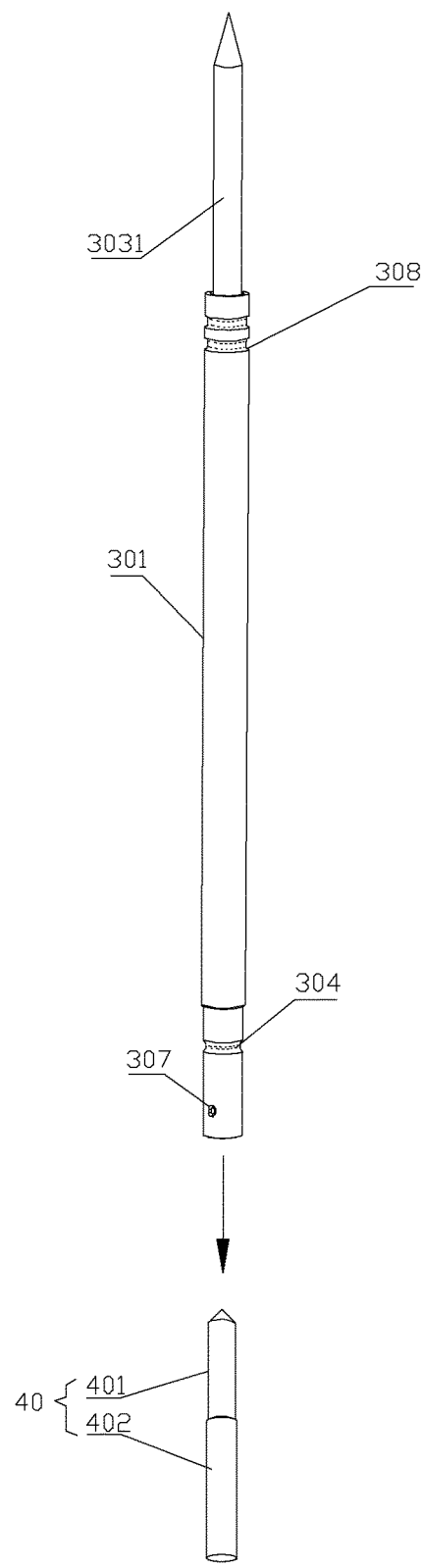
FIG. 5 is a three-dimensional view of the second embodiment of a test probe component of the present invention, before the assembling is complete.
Figure 6:
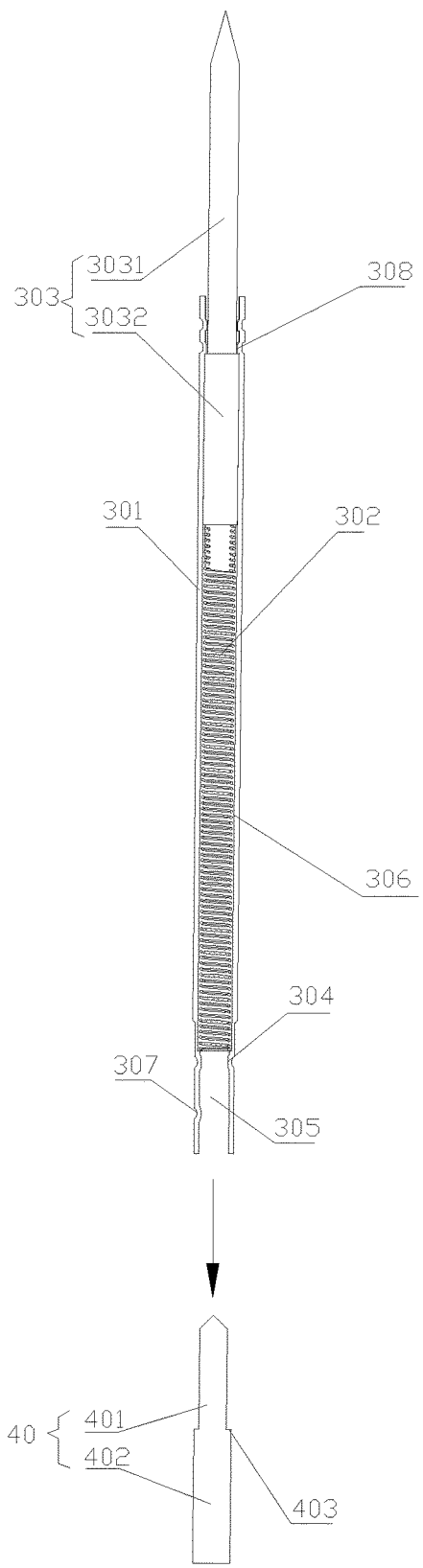
FIG. 6 is a sectional view of the second embodiment of a test probe component of the present invention, before the assembling is complete.
Figure 7:
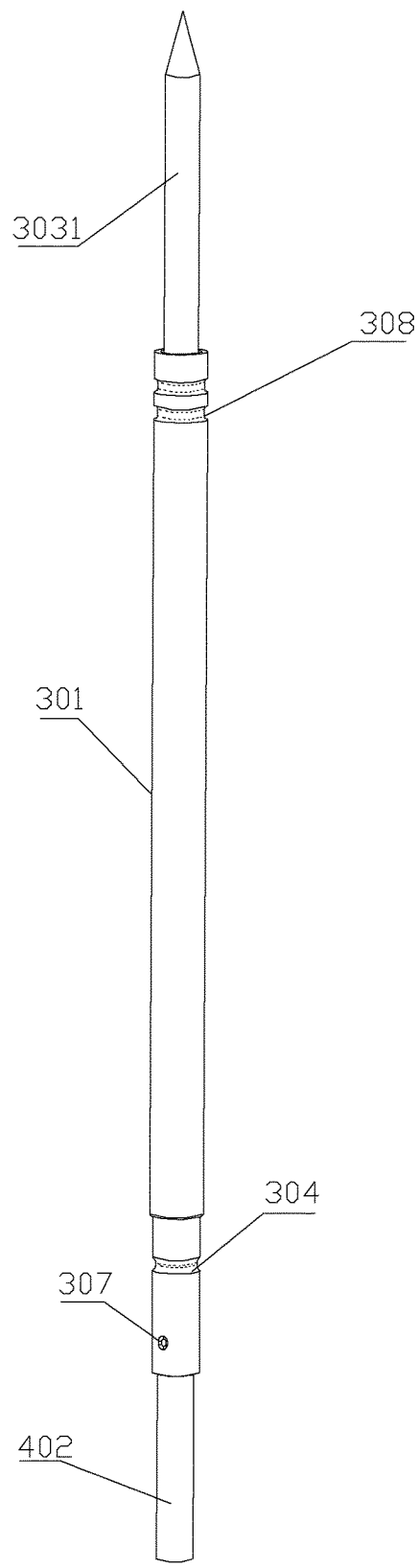
FIG. 7 is a three-dimensional view of the second embodiment of a test probe component of the present invention, after the assembling is complete.
Figure 8:
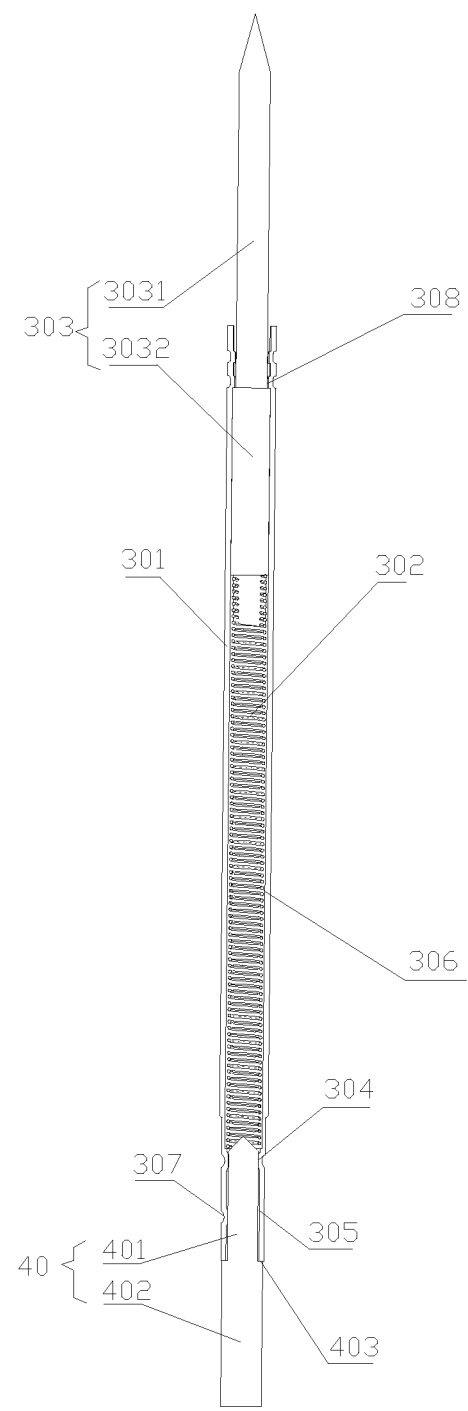
FIG. 8 is a sectional view of the second embodiment of a test probe component of the present invention, after the assembling is complete.

Further refer to FIGS. 5-8. FIG. 5 is a three-dimensional view of the second embodiment of a test probe component of the present invention, before the assembling is complete. FIG. 6 is a sectional view of the second embodiment of a test probe component of the present invention, before the assembling is complete. FIG. 7 is a three-dimensional view of the second embodiment of a test probe component of the present invention, after the assembling is complete. FIG. 8 is a sectional view of the second embodiment of a test probe component of the present invention, after the assembling is complete.

As shown in FIG. 5 and FIG. 6, in the second embodiment of the test probe component, the test probe component comprises the test probe (30) and the gold finger (40) as shown in FIG. 3 and FIG. 4. The gold finger (40) comprises an insertion portion (401) and a fixing portion (402) which are in butt joint; the cross section size of the fixing portion (402) is greater than that of the insertion portion (401) such that the joint between the insertion portion (401) and the fixing portion (402) forms a step face (403); the first accommodating chamber (305) of the probe body (301) can be inserted into the insertion portion (401) of the gold finger (40) along the arrow direction as shown in FIG. 5 and FIG. 6, and after insertion, the step face (403) can be abutted on one end of the probe body (301).

As shown in FIG. 7 and FIG. 8, the test probe (30) is inserted into the insertion portion (401) of the gold finger

(40) to complete the assembling, and then one end of the probe body (301) is supported on the step face (403). The fixing portion (402) of the gold finger (40) is fixed at the circuit board, so the step face (403) can be supported against one end of the probe body (301). Therefore, when stressed by a force along the axial direction of the test probe (30) and towards the gold finger (40), the test probe (30) and the gold finger (40) can keep relative fixation. Optionally, the gold finger (40) can be set to insert the first accommodating chamber (305) and contact the elastic member (302) in the second accommodating chamber (306), and the elastic member (302) can be a conductor so as to increase the conductive area of the test probe (30).

Figure 9:
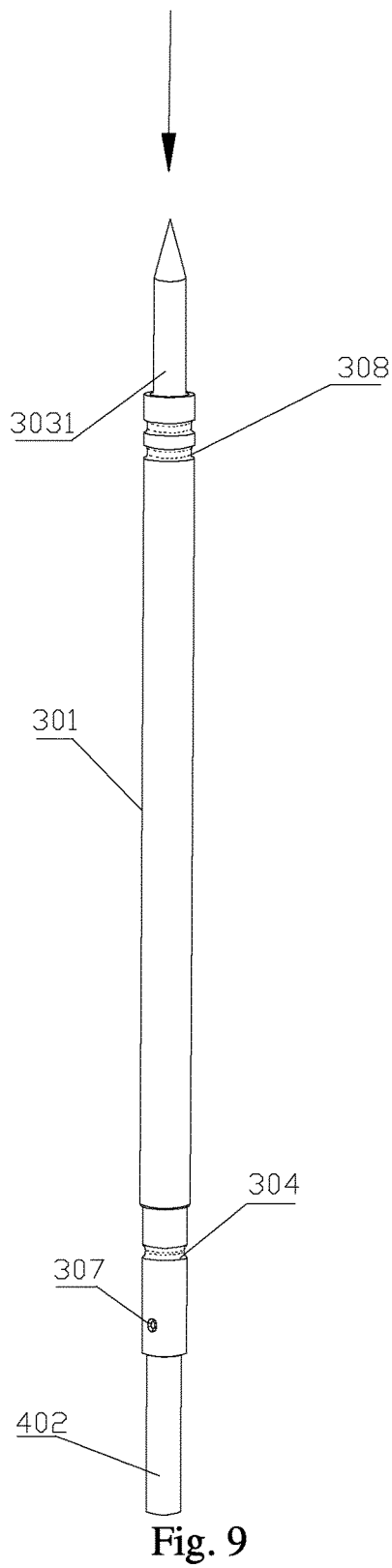
FIG. 9 is a three-dimensional view of the second embodiment of a test probe component of the present invention, after the probe head is compressed.
Figure 10:
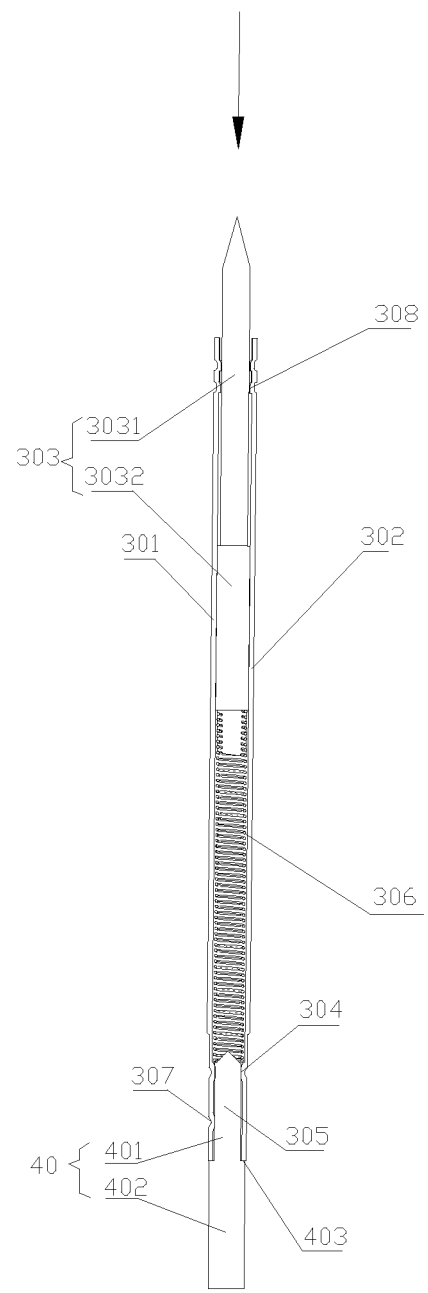
FIG. 10 is a sectional view of the second embodiment of a test probe component of the present invention, after the probe head is compressed.

Further refer to FIG. 9 and FIG. 10. FIG. 9 is a three-dimensional view of the second embodiment of a test probe of the present invention after the probe head is stressed and compressed, and FIG. (10) is a sectional view of the second embodiment of a test probe of the present invention. After the assembling is complete, the probe head (303) drives the elastic member (302) to shrink when receiving the thrust along the axial direction of the probe head (303) (the arrow direction as shown in the figure), thus reducing the length of the test probe (30). At the same time, the elastic member (302) generates an elastic force on the probe head (303) after shrinking, so the top of the probe head (303) can be tightly abutted on the force applying article in contact.

During production of the test probe (30), a first flange can be formed at the corresponding position of the probe body (301) by extruding the probe body (301) inside so as to obtain the first support portion (304). Likewise, the first flange can be formed by extruding the probe body (301) inside so as to obtain the second support portion (308).

Optionally, the inner wall of the probe body (301) can be formed with a step structure so as to obtain the first support portion (304), wherein the step structure can be formed by means of punching, etc.

Figure 11:
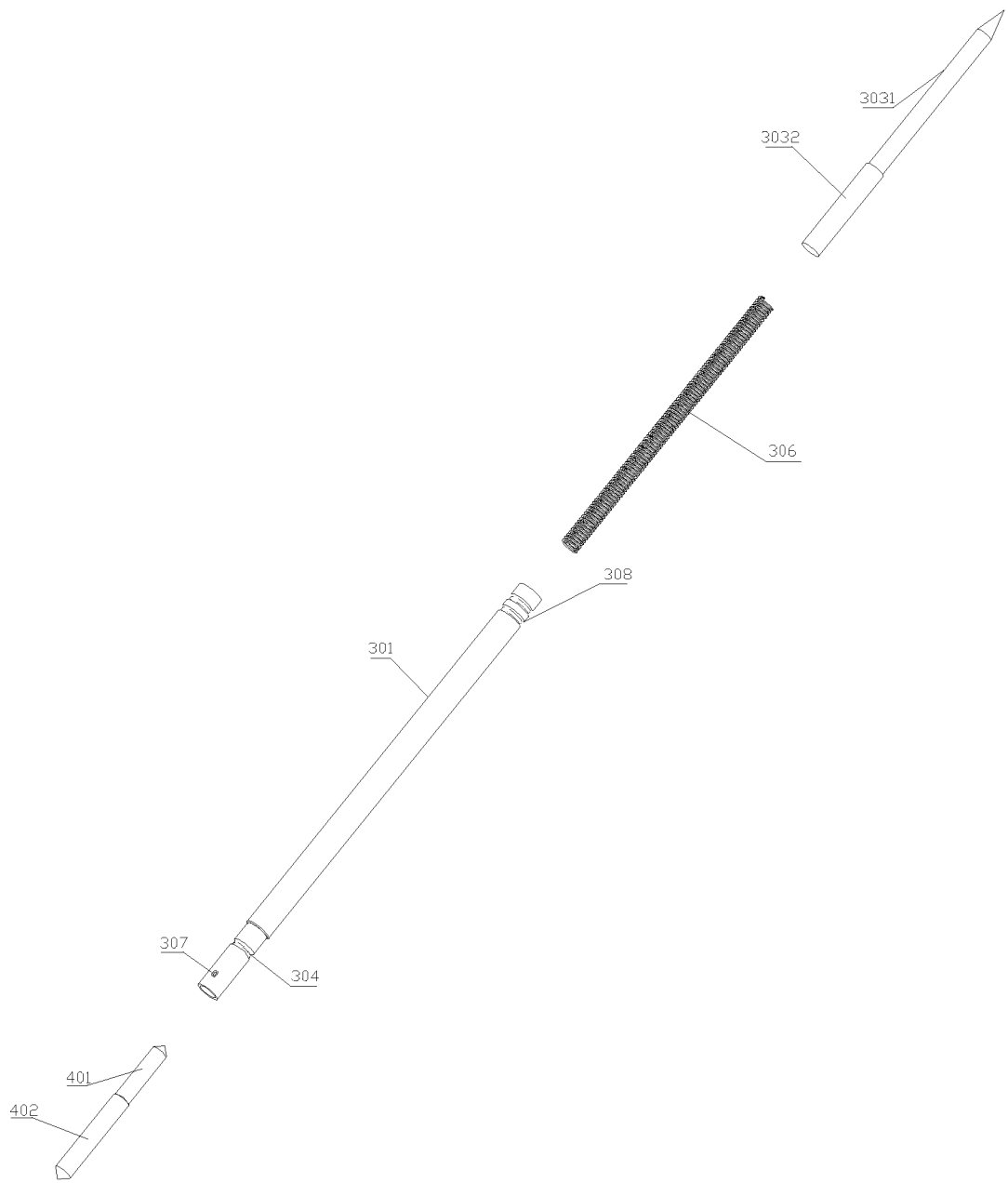
FIG. 11 is an exploded view of the second embodiment of a test probe component of the present invention.

Refer to FIG. 11. FIG. 11 is an exploded view of the second embodiment of a test probe component of the present invention. As shown in FIG. 11, the probe body (301), the elastic member (302), and the probe head (303) form the test probe (30), and the test probe (30) can be inserted into and removed from and fixed at the gold finger (40) so as to form the test probe component. In this embodiment, the probe body (301), the elastic member (302), the probe head (303) and the gold finger (40) all are made of conductive metals, and the elastic member (302) is preferably a metal spring.

Refer to FIG. (10) again. Preferably, in this embodiment of the present invention, the axial length of the first accommodating chamber (305) is set to be smaller than the insertion length of the gold finger (40) such that one end of the gold finger (40) is inserted into the second accommodating chamber (306) and contacts the metal spring in the second accommodating chamber (306). Then, the conductive path of the test probe component is: "probe head (303)-probe body (301)-gold finger (40)" and "probe head (303)-metal spring-gold finger (40)". One end of the gold finger (40) contacts the metal spring, so in this embodiment, another conductive path "probe head (303)-metal spring-gold finger (40)" can be added, thus increasing the current passing through the test probe component and improving the test accuracy.

Furthermore, the first accommodating chamber (305) is required to accommodate the insertion portion (401) of the gold finger (40), so the cross section size of the probe body (301) is greater than that of the insertion portion (401) of the gold finger (40). Besides, the probe handle (3032) and the probe rod (3031) are accommodated in the second accommodating chamber (306) of the probe body (301), and when the cross section size of the probe body (301) is increased, the cross section sizes of the probe handle (3032) and the probe rod (3031) are correspondingly increased, thus improving the structural strength of the test probe (30), increasing the current passing through the probe rod (3031) and thus further improving the test accuracy.

Further refer to FIGS. 3-12. The first accommodating chamber (305) is internally provided with at least two projections which are formed by extruding probe body (301) inside, and the at least two projections hold the gold finger (40). Wherein, the projections can be a ring-shaped projection (304) and a dot-like projection (307), in which the ring-shaped projection (304) is the first support portion (304). In addition, they also play the role of supporting the elastic member (302), the first support (304) can also hold the insertion portion (401) of the gold finger (40).

To complete the assembling of the test probe component, it is only needed to insert the gold finger (40) into the first accommodating chamber (306) of the probe body (301), and after the assembling, the step face (403) and the projections can hold and fix the test probe, so the test probe component provided by the present invention has advantages of simple assembling and firmness.

Figure 12:
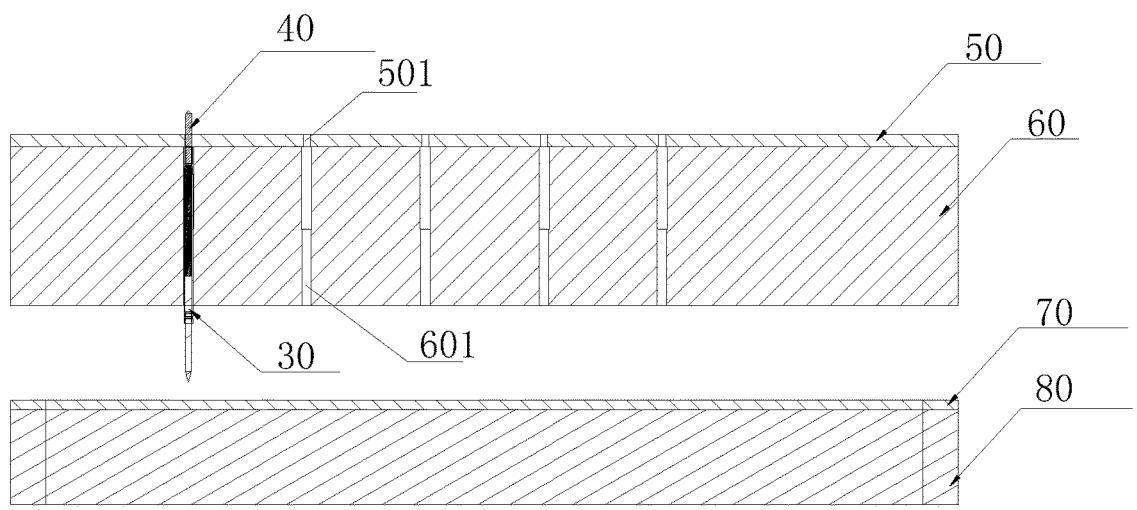
FIG. 12 is a structural view of the second embodiment of a test platform of the present invention.

The embodiment of the present invention also provides the second implementation mode of the test platform. See FIG. 12 for details. FIG. 12 is a structural view of the second embodiment of a test platform of the present invention. As shown in FIG. 12, the test platform comprises a signal detecting circuit board (50), a test probe (30), a gold finger (40), a probe plate (60), a carrier (80) and a circuit board to be tested (70). The gold finger (40) is fixed on the signal detecting circuit board (50). The signal detecting circuit board (50) is fixed on the probe plate (60). The probe plate (60) is provided with a through-hole (601). The test probe (30) comprises a probe body (301) and a probe head (303); one end of the probe body (301) is of a hollow design, thereby cooperating the gold finger (40) through insertion. The test probe (30) penetrates and partly projects out of the through-hole (601). The circuit board to be tested (70) is disposed on the carrier (80), on the side opposite to the test probe (30). The probe head (303) is disposed at the other end of the probe body (301). The probe plate (60) moves relative to the carrier (80) such that the probe head (303) is connected with the test point on the circuit board to be tested (70), thus establishing electric connection between the signal detecting circuit board (50) and the circuit board to be tested (70).

In this embodiment, a hydraulic drive device can be employed to drive the probe plate (60) to move relative to the carrier (80). Of course, within the scope where those skilled in this field can understand, other drive modes such as the stepping motor can be used. The present invention has no specific definition on this point.

Preferably, in this embodiment of the present invention, one end of the probe rod (3031) opposite to the probe handle (3032) can be shaped as a cone to facilitate contact with the test point on the circuit board to be tested (70). It is worth noting that, in the alternative implementation modes of the present invention, one end of the probe rod (3031) opposite to the probe handle (3032) can be set into other shapes matched with the test point on the circuit board to be tested (70).

Figure 13:
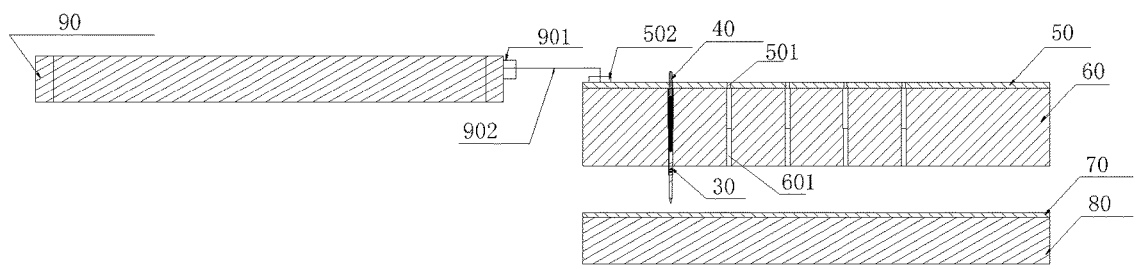
FIG. 13 is a structural view of the third embodiment of a test platform of the present invention.

Furthermore, refer to FIG. 13. FIG. 13 is a structural view of the third embodiment of a test platform of the present invention. Compared with the second embodiment of the test platform, the test platform in this embodiment further comprises an instrument (90); the signal detecting circuit board (50) is provided with an interface (501); the instrument (90) is connected with the signal detecting circuit board (50) through a connecting wire (902), wherein the connecting wire (902) is respectively connected with the instrument interface (901) and the interface (502) of the signal detecting circuit (50) such that the instrument (90) can detect the signals of the test point of the circuit board to be tested (70). For example, the instrument (90) may be an oscilloscope, a computer terminal, etc.

It is worth noting that, the test probe (30) and gold finger (40) used in the second and third embodiments of the test platform of the present invention can be the test probe (30) and the gold finger (40) as shown in FIGS. 3-9 and described above, and there are not described in details here.

The gold finger (40) disclosed in the embodiment of the present invention can be fixed on the signal detecting circuit board (50) by welding. See FIGS. 12 and 13 for details. The fixing portion (402) of the gold finger (40) can be inserted into an insertion hole (501) on the signal detecting circuit board (50) and welded on the surface of the signal detecting circuit board (50) relative to the test probe (30). The gold finger (40) disclosed in the embodiment of the present invention comprises the insertion portion (401) and the fixing portion (402) which are in butt joint, and it shaped as a strip, so it is not needed to worry about that the solder paste seeps into the gold finger (40) to cause the problem of insufficient accuracy of the test probe (30) inserted thereon during the welding.

So by the above technical solution, the embodiments of the present invention provide a test probe, a test probe component and a test platform. One end of the probe body is of a hollow design to cooperate with the gold finger through insertion, thus solving the current technical problems of the assembling of the probe being relatively difficult, the requirements for processing of the through-hole being relative high, and the powering on being unstable.

The above are only some embodiments of the present invention and shall not be regarded as limit to the present invention. Any equivalent structure or equivalent flow modifications made on the basis of the description and attached drawings of the present invention, or director or indirect application to other related fields, shall fall within the protective scope of the present invention.

What is claimed is:

1. A test probe comprising:
    a probe body, at least one end of the probe body being of a hollow design, thereby cooperating with a gold finger through insertion;
    an elastic member, and
    a probe head,
    wherein the probe body is axially provided with a through-cavity, an inner wall of the probe body is provided with a first support portion, the first support portion divides the through-cavity into a first accommodating chamber and a second accommodating chamber which are respectively connected with two ends of the probe body, the first accommodating chamber is configured to receive the gold finger, the elastic member is disposed in the second accommodating chamber and one end of the elastic member is supported on the first support portion, the probe head being partly disposed in the second accommodating chamber and supported on another end of the elastic member, and
    wherein the elastic member is a metal spring, an axial length of the first accommodating chamber is set to be smaller than an insertion length of the gold finger such that one end of the gold finger is inserted into the second accommodating chamber and contacts the metal spring in the second accommodating chamber.

2. The test probe of claim 1, wherein the first accommodating chamber is internally provided with at least two projections which are formed by extruding the probe body inwardly, and the at least two projections are used for holding the gold finger.

3. The test probe of claim 1, wherein the probe head is capable of driving the elastic member to withdraw by the thrust effect along its axial direction, thus reducing a length of the test probe.

4. The test probe of claim 1, wherein the first support portion is a first flange or a step structure, the first flange is formed by extruding the probe body inwardly, while the step structure is formed on the inner wall of the probe body.

5. The test probe of claim 1, wherein the probe head comprises a probe rod and a probe handle disposed at one end of the probe rod, wherein a cross section size of the probe handle is greater than a cross section size of the probe rod, the probe handle is disposed in the second accommodating chamber, the inner wall of the probe body is provided with a second support portion, and the probe handle is limited in the second accommodating chamber by the second support portion.

6. The test probe of claim 5, wherein the second support portion is a second flange which is formed by extruding the probe body inwardly.

7. The test probe of claim 1, wherein the gold finger comprises an insertion portion and a fixing portion which are in a butt joint, a cross section size of the fixing portion is greater than a cross section size of the insertion portion such that a step face is formed at the butt joint between the insertion portion and the fixing portion, and one end of the probe body is supported on the step face.

8. A test probe component comprising:
    a gold finger fixed on a printed circuit board through insertion; and
    a test probe comprising a probe body, an elastic member, and a probe head, one end of the probe body being of a hollow design, thereby cooperating with the gold finger,
    wherein the probe body is axially provided with a through-cavity, an inner wall of the probe body is provided with a first support portion, the first support portion divides the through-cavity into a first accommodating chamber and a second accommodating chamber which are respectively connected with two ends of the probe body, the first accommodating chamber is configured to receive the gold finger, the elastic member is disposed in the second accommodating chamber and one end of the elastic member is supported on the first support portion, the probe head is disposed in the second accommodating chamber and is supported on another end of the elastic member, and the probe head is configured to drive the elastic member to withdraw by a thrust effect along an axial direction, thus reducing a length of the test probe, and
    wherein the elastic member is a metal spring, an axial length of the first accommodating chamber is set to be smaller than an insertion length of the gold finger such that one end of the gold finger is inserted into the second accommodating chamber and contacts the metal spring in the second accommodating chamber.

9. The test probe component of claim 8, wherein the first accommodating chamber is internally provided with at least two projections which are formed by extruding the probe body inwardly, and the at least two projections are used for holding the gold finger.

10. The test probe component of claim 8, wherein the gold finger comprises an insertion portion and a fixing portion which are in a butt joint, a cross section size of the fixing portion is greater than a cross section size of the insertion portion such that a step face is formed at the butt joint between the insertion portion and the fixing portion, and one end of the probe body is supported on the step face.

11. The test probe component of claim 8, wherein the probe head comprises a probe rod and a probe handle disposed at one end of the probe rod, wherein a cross section size of the probe handle is greater than a cross section size of the probe rod, the probe handle is disposed in the second accommodating chamber, the inner wall of the probe body is provided with a second support portion, the probe handle is limited in the second accommodating chamber by the second support portion, the first support portion is a first flange or a step structure, the first flange is formed by extruding the probe body inwardly, while the step structure is formed on the inner wall of the probe body, and the second support portion is a second flange which is formed by extruding the probe body inwardly.

12. A test platform comprising:
a signal detecting circuit board;
a gold finger fixed on the signal detecting circuit board;
a test probe comprising a probe body and a probe head, and one end of the probe body being of a hollow design, thereby cooperating with the gold finger through insertion;
a probe plate;
a carrier;
a circuit board to be tested; and
an instrument,
wherein the signal detecting circuit board is disposed on the probe plate, the probe plate is provided with a through-hole, the test probe penetrates and partly projects out of the through-hole, the circuit board to be tested is disposed on the carrier on a side relative to the test probe, the probe head is disposed at another end of the probe body, the probe plate moves relative to the carrier such that the probe head is connected with a test point on the circuit board to be tested, thereby establishing electric connection between the signal detecting circuit board and the circuit board to be tested, and the instrument is connected with an interface of the signal detecting circuit board through an instrument interface to detect signals from the test point of the signal detecting circuit board, wherein the test probe further comprises an elastic member, the probe body is axially provided with a through-cavity, an inner wall of the probe body is provided with a first support portion, the first support portion divides the through-cavity into a first accommodating chamber and a second accommodating chamber which are respectively connected with two ends of the probe body, the first accommodating chamber is configured to receive the gold finger, the elastic member is disposed in the second accommodating chamber and one end of the elastic member is supported on the first support portion, the probe head being disposed in the second accommodating chamber and supported on another end of the elastic member, and wherein the elastic member is a metal spring, an axial length of the first accommodating chamber is set to be smaller than an insertion length of the gold finger such that one end of the gold finger is inserted into the second accommodating chamber and contacts the metal spring in the second accommodating chamber.

13. The test platform of claim 12, wherein the probe head is capable of driving the elastic member to withdraw by the thrust effect along its axial direction, thus reducing a length of the test probe.

14. The test platform of claim 13, wherein the gold finger comprises an insertion portion and a fixing portion which are in a butt joint, a cross section size of the fixing portion is greater than a cross section size of the insertion portion such that a step face is formed at the butt joint between the insertion portion and the fixing portion, and one end of the probe body is supported on the step face, the first accommodating chamber is internally provided with at least two projections which are formed by extruding the probe body inwardly, and the at least two projections are used for holding the gold finger.

15. The test platform of claim 13, wherein the probe head comprises a probe rod and a probe handle disposed at one end of the probe rod, wherein a cross section size of the probe handle is greater than a cross section size of the probe rod, the probe handle is disposed in the second accommodating chamber, the inner wall of the probe body is provided with a second support portion, the probe handle is limited in the second accommodating chamber by the second support portion, the first support portion is a first flange or a step structure, the first flange is formed by extruding the probe body inwardly, while the step structure is formed on the inner wall of the probe body, and the second support portion is a second flange which is formed by extruding the probe body inwardly.

* * * * *